US008089055B2

(12) United States Patent
Brailove

(10) Patent No.: US 8,089,055 B2
(45) Date of Patent: Jan. 3, 2012

(54) ION BEAM PROCESSING APPARATUS

(76) Inventor: Adam Alexander Brailove, San Jose, CA (US)

( * ) Notice: Subject to any disclaimer, the term of this patent is extended or adjusted under 35 U.S.C. 154(b) by 994 days.

(21) Appl. No.: 12/031,696

(22) Filed: Feb. 14, 2008

(65) Prior Publication Data

US 2011/0121207 A1 May 26, 2011

Related U.S. Application Data

(60) Provisional application No. 61/026,371, filed on Feb. 5, 2008.

(51) Int. Cl.
*A61N 5/00* (2006.01)
(52) U.S. Cl. ............. 250/492.2; 250/492.1; 250/491.1
(58) Field of Classification Search .................. None
See application file for complete search history.

(56) References Cited

U.S. PATENT DOCUMENTS

| | | | | |
|---|---|---|---|---|
| 4,030,622 | A * | 6/1977 | Brooks et al. ............... 414/290 |
| 4,141,458 | A * | 2/1979 | Brooks et al. ............ 414/331.18 |
| 4,346,301 | A * | 8/1982 | Robinson et al. .......... 250/492.2 |
| 5,128,173 | A * | 7/1992 | Kugan ........................ 427/530 |
| 5,215,789 | A * | 6/1993 | Kugan ........................ 427/458 |
| 5,483,077 | A * | 1/1996 | Glavish ..................... 250/492.2 |
| 6,063,248 | A * | 5/2000 | Bourez et al. ........... 204/298.25 |
| 6,228,429 | B1 * | 5/2001 | Bluck et al. ................. 427/331 |
| 6,414,328 | B1 * | 7/2002 | Nussupov ................ 250/492.21 |
| 6,653,242 | B1 * | 11/2003 | Sun et al. ..................... 438/738 |
| 6,709,316 | B1 * | 3/2004 | Sun et al. ...................... 451/41 |
| 6,899,592 | B1 * | 5/2005 | Kojima et al. ................... 451/6 |
| 2001/0028041 | A1 * | 10/2001 | Hubbard .................... 250/492.1 |
| 2002/0068454 | A1 * | 6/2002 | Sun et al. ..................... 438/692 |
| 2002/0090820 | A1 * | 7/2002 | Sun et al. ..................... 438/690 |
| 2002/0104269 | A1 * | 8/2002 | Sun et al. ...................... 51/309 |
| 2002/0148732 | A1 * | 10/2002 | Emesh et al. ................ 205/117 |
| 2002/0160692 | A1 * | 10/2002 | Rivoire et al. .................. 451/41 |
| 2003/0013306 | A1 * | 1/2003 | Tsai et al. .................... 438/692 |
| 2003/0127320 | A1 * | 7/2003 | Emesh et al. ................ 204/207 |
| 2003/0216049 | A1 * | 11/2003 | Sun et al. ..................... 438/697 |
| 2004/0053499 | A1 * | 3/2004 | Liu et al. ...................... 438/689 |
| 2005/0092620 | A1 * | 5/2005 | Mavliev et al. ............... 205/662 |
| 2006/0088949 | A1 * | 4/2006 | Smayling et al. ............... 438/14 |
| 2006/0115986 | A1 * | 6/2006 | Donohoe et al. ............. 438/690 |
| 2008/0085174 | A1 * | 4/2008 | Rebstock ................ 414/222.12 |
| 2008/0086237 | A1 * | 4/2008 | Rebstock ...................... 700/248 |
| 2009/0008600 | A1 * | 1/2009 | Jia et al. ...................... 252/79.1 |
| 2009/0068849 | A1 * | 3/2009 | Endo et al. ................... 438/763 |
| 2010/0084569 | A1 * | 4/2010 | Proudfoot et al. ........ 250/423 R |

* cited by examiner

*Primary Examiner* — Robert Kim
*Assistant Examiner* — Andrew Smyth

(57) ABSTRACT

An ion-cut machine and method for slicing silicon ingots into thin wafers for solar cell manufacturing is set forth, amongst other embodiments and applications. One embodiment comprises two carousels: first carousel (100) adapted for circulating workpieces (55) under ion beam (10) inside target vacuum chamber (30) while second carousel (80) is adapted for carrying implanted workpieces through a sequence of process stations that may include annealing (60), cleaving (70), slice output (42), ingot replacement (52), handle bonding, cleaning, etching and others. Workpieces are essentially swapped between carousels. In one embodiment, the swapping system comprises a high throughput load lock (200) disposed in the wall of the vacuum chamber (30), a vacuum swapper (110) swapping workpieces between first carousel (100) and load lock (200), and an atmospheric swapper (90) swapping workpieces between load lock (200) and second carousel (80).

13 Claims, 6 Drawing Sheets

ION BEAM PROCESSING APPARATUS

CROSS-REFERENCE TO RELATED APPLICATIONS

This application claims the benefit of provisional patent application No. 61/026,371 filed 5 Feb. 2008 by the present inventor.

FEDERALLY SPONSORED RESEARCH

Not applicable

SEQUENCE LISTING OR PROGRAM

Not applicable

FIELD OF THE INVENTION

This invention relates generally to equipment, techniques, and processes for ion beam-slicing of wafers and ingots of semiconductor materials and other materials. The invention is applicable to a variety of widely used processes such as ion beam induced exfoliation, ion-slicing, layer transfer, and similar processes wherein materials or workpieces are treated with or exposed to ion fluxes allowing a relatively thin layer of the material to be cleaved off and optionally bonded to another substrate. The present invention is also applicable to ion-implantation equipment used in the doping of semiconductors.

BACKGROUND OF THE INVENTION

Ion-Cut Process

One process of interest here is the ion-cut (or ion-slicing, or ion-beam exfoliation) process as applied to solar cell fabrication. Typically, crystalline silicon slices for solar cells range from less than 100 hundred microns thick up to several hundred microns thick and are frequently cut from ingots by wire-saw. This method is limited in terms of how thinly the slices can be cut. It also results in considerable waste of silicon material due to the kerf that is removed by the saw. The material lost as a percentage of the total only increases as the slices grow thinner.

Most generally, the ion-cut process, which has achieved commercial success in microelectronics substrate engineering, involves directing an ion beam from an ion implanter or particle accelerator, at a crystalline substrate such as a silicon wafer and implanting the ions beneath its surface. Generally hydrogen or helium ions are implanted. The ions come to rest in a very thin layer just below the surface, the depth of which is dependent on the mass and initial energy of the ions and which can be reliably predicted using well-known theories of charged particle interactions with matter. The widely used TRIM or SRIM software code is often used to perform these calculations. FIG. 1 shows data from SRIM relating the penetration depth (known as "projected range") of hydrogen ions into silicon as a function of incident ion energy. For example, hydrogen ions impinging on silicon at 3 MeV will stop at a depth of approximately 92 micrometers below the surface, in the range of typical thickness for crystalline solar cell fabrication. In general, ion-cut processes can range from tens of keV for very thin bonded layers, up to arbitrarily high energies for thick, self-supporting slices.

The resulting subsurface damage layer is concentrated around the depth where the ions stop and it weakens the crystal structure at that depth. Subsequent external heating of the substrate consolidates the implanted gas and nucleates and grows micro-bubbles, further weakening the crystal lattice. Given a sufficient dose of implanted ions and the appropriate application of heat or other source of stress to initiate cleavage, the crystal can be induced to cleave along the plane of the implanted layer yielding a thin crystalline sheet. For stability, very thin layers are generally bonded to a mechanically supportive 'handle' prior to cleaving.

The potential use of the ion-cut process for solar cell manufacturing is described in the technical literature, for example: "Crystalline thin-film silicon solar cells from layer-transfer processes: a review", R. Brendel, Proc. 10th Workshop on Crystalline Silicon Solar Cell Materials and Processes, Aug. 13-16, 2000, Copper Mountain, USA, B. L. Sopori, ed. Advantageously, the ion-cut slices can be cut as thin as desired and there is minimal wasted material since the material is cleaved rather than sawn. A single ingot can be repeatedly sliced to yield a large number of slices.

Cooling

One technical hurdle is the removal of heat deposited by the ion beam. On one hand, it is necessary that the implant be performed at temperatures below roughly 400 or 500 C, otherwise the implanted ions may diffuse away during implantation, or uncontrolled, premature cleaving and bubble formation could occur. On the other hand, it is desirable that the beam flux (ion current) be high in order to achieve maximum possible productivity. The substrate may easily be subjected to tens of kilowatts of power into its surface owing to high beam currents in combination with beam energies in the MeV range.

It will be readily apparent to those familiar with accelerator and ion implantation art that a further complication arises due to the necessity to produce, transport and deliver ion beams in vacuum. Cooling of objects in vacuum is widely known to be quite difficult since there is substantially no gas present to aid in the conduction of heat across mechanical joints.

One well known method of controlling the temperature of a workpiece is to cool the surface opposite the surface receiving the energy. This approach is widely used in commercial ion implanters, for example, and also numerous other types of semiconductor processing equipment. The workpiece, generally a silicon wafer less than 1 mm thick, is secured to a cooled support plate either by electrostatic chuck, centrifugal force, or mechanical clamp. A small amount of low pressure gas, typically helium, hydrogen or nitrogen, between 5 and 50 Torr, is bled into the tiny gap between the back of the workpiece and the support plate in order to enhance heat conduction across the gap. The leakage of this so-called "back-side gas" from behind the workpiece into the main vacuum chamber is low enough that it does not appreciably raise the overall pressure of the vacuum system. The size of the gap is determined by the curvature and roughness of the surfaces in contact, and their ability to conform to each other under light pressure. Typical gaps range from 10-50 microns for hard materials. For example, across a 25 micron gap, the specific thermal resistance will be 0.00016 K-m$^2$/W for helium and 0.00095 K-m$^2$/W for nitrogen. If the ion beam is directed into a single workpiece, the area averaged power densities that may be encountered in the solar cell manufacturing process described above can exceed 1 MW/m$^2$ depending on the available ion beam current. The resulting temperature drop across the gap alone can be several hundred or even 1000 degrees C. The thermal resistance of the gap increases at the back-side gas pressure drops below roughly 50 Torr.

Furthermore, for relatively thick workpieces as in the solar application described above, there is an additional temperature drop between the surface receiving the ion beam treatment and the cooled back surface due to the thermal resistance of the workpiece itself. For example, a 2 cm thick ingot of silicon at 400 C will have a specific thermal resistance of 0.0004 K-m$^2$/W which can easily add several hundred degrees C. addition temperature delta. In the case of the ion-cut solar application, the workpiece is successively made thinner as slices are removed from the implanted surface. The temperature difference between the implanted surface and the cooled surface therefore changes over time. This can negatively impact the reproducibility of the process and the size of the process window.

One obvious solution to this problem is to process multiple workpieces simultaneously by spreading the ion beam over a large area, thereby reducing the average power density into each workpiece and reducing the temperature drops. Stated equivalently, the total power delivered by the beam is removed through a larger cooling surface. This is an effective method but it incurs the difficulties of processing multiple workpieces simultaneously. The ion beam optical elements, such as electromagnets or electrostatic deflectors, which are used to scan and collimate the beam must be larger and more expensive. All the vacuum chambers and workpiece handling mechanisms will also be larger, more complex, and more expensive in order to handle arrays of workpieces.

Such difficulties with workpiece temperature control and ion beam heating of the substrate are widely known in the ion-implantation of wafers for semiconductor chip making The problem is obviously most acute for implantation at relatively high beam current and high energy. A commonly used technique is to arrange a plurality of workpieces, typically 13 or 25, on the periphery of a spinning disk. This spreads the heat flux over multiple workpieces by distributing the beam flux across multiple workpieces in time, rather than space. This approach however also requires the wafers to be processed in batches which complicates and adds cost to the equipment overall. The large disk has significant inertia and takes time to achieve the required speed before the ion beam can be applied to the workpieces, reducing equipment productivity.

OBJECT OF THE INVENTION

Accordingly, it is a general object of this invention to provide a machine architecture and process sequence that performs ion-cut processing of wafers or ingots of material but is that also simple, reliable, flexible and has low cost-of-ownership. Some particular objects of this invention include the:

i. Providing an ion beam processing system wherein the workpieces are processed serially rather than in batches;
ii. spreading of ion beam heat load across multiple to prevent workpiece temperature from becoming excessive;
iii. avoiding the use of workpiece carriers or trays which require additional automated handling and periodic refurbishment;
iv. minimizing the size and cost of ion beam scanning and delivery components such as magnets;
v. providing a low volume, high speed vacuum load lock to enable high productivity while minimizing the pump cost;
vi. providing a vacuum load lock that conforms generally to the shape of the workpiece, even as the workpiece grows smaller with repeated slicing;
vii. providing an integrated workpiece handling system adapted for a cyclic flow of workpieces, as in the repeated slicing of workpieces;
viii. providing an integrated workpiece handling system adapted for performing multiple process steps in parallel for high productivity;
ix. minimizing the amount of work-in-process material in order to minimize losses due to machine failure;
x. minimizing the overall size the target chamber to reduce the quantity and cost of radiation shielding;
xi. providing mechanically simple loading and unloading of fresh workpieces and completed slices;
xii. allowing for easy scalability of the system for different workpiece dimensions and to higher beam currents;
xiii. providing a system architecture that is flexible and modular whereby process modules can be added or removed easily;
xiv. providing a processing system wherein sensing elements such as for workpiece temperature and beam current are fewer since the workpieces move sequentially past the sensors rather than requiring a multiplicity of separate sensors for addressing multiple workpieces in parallel.

While the following description of the invention makes particular reference to the ion-cut slicing of silicon ingots as mentioned above, this is not intended to restrict the more general applicability of the invention.

SUMMARY OF THE INVENTION

The ion-slicing embodiment of the present invention comprises two main process carousels. Other embodiments directed at ion implantation for semiconductor manufacturing may comprise only a single carousel however the following description will focus initially on the ion-cut embodiments.

The term 'carousel' is intended here to refer very generally to any device for circulating a plurality of workpieces along a path or a sequence of discreet stations, as in a circulating conveyor system, wheel, or turret etc. A carousel adapted to receive only two workpieces and exchange them between two discreet positions we refer to as a 'swapper'. In the present application, the term 'carousel' is generally used to refer to one of the two main workpiece processing carousels, whereas 'swapper' generally refers to a workpiece transfer device used simply to move workpieces around. In one embodiment, however, one swapper also functions as a minimalist process carousel.

The first carousel is adapted to support a plurality of workpieces, and is particularly adapted to expose the workpieces to an ion beam and to cool them. The first carousel begins stationary, with one of its workpieces in a preselected first transfer position. The first carousel then begins moving and exposing the workpieces sequentially through the ion beam. The first carousel then stops with a different workpiece located in the specified first transfer position. This operation of the first carousel is one of the key elements of the invention and will be described more fully in the detailed description below.

At least one second carousel, also adapted to support a plurality of workpieces, generally handles any other post-implant process steps that may be required, such as annealing, bonding, cleaving, cleaning, surface treatment, outputting slices, receiving fresh ingots, etc. In a preferred embodiment, the second carousel shifts all its workpieces to subsequent processing stations at the same frequency that the first carousel performs one complete implant cycle. In this way, these post-implant process steps are performed in parallel on a plurality of workpieces. The first (and final) station of the second carousel is define to be second transfer position.

As slices of workpieces are removed from the second carousel, the remainder of the workpiece must be returned to the first carousel for subsequent slicing. Transfer mechanisms are provided to essentially perform a swap between carousels: the implanted workpiece at the first transfer position of the first carousel is swapped with the completed workpiece at the second transfer position of the second carousel.

In a preferred embodiment, however, the first carousel in situated inside a vacuum chamber, as vacuum is generally necessary for the transport of ion beams. The second carousel may be situated inside or outside the vacuum chamber depending on the details of the post-implant processes. In one embodiment illustrated herein it is assumed the second carousel is outside the implant vacuum chamber. As a result, the swapping process not direct, but includes multiple swaps and a transfer in or out of vacuum of the respective workpiece through a vacuum load lock device. The carousel mechanisms and the swap mechanisms can be realized in a variety of ways. One particular embodiment employs a novel variable volume load lock that enables high speed transfer of workpieces in and out of vacuum.

Figure 1:
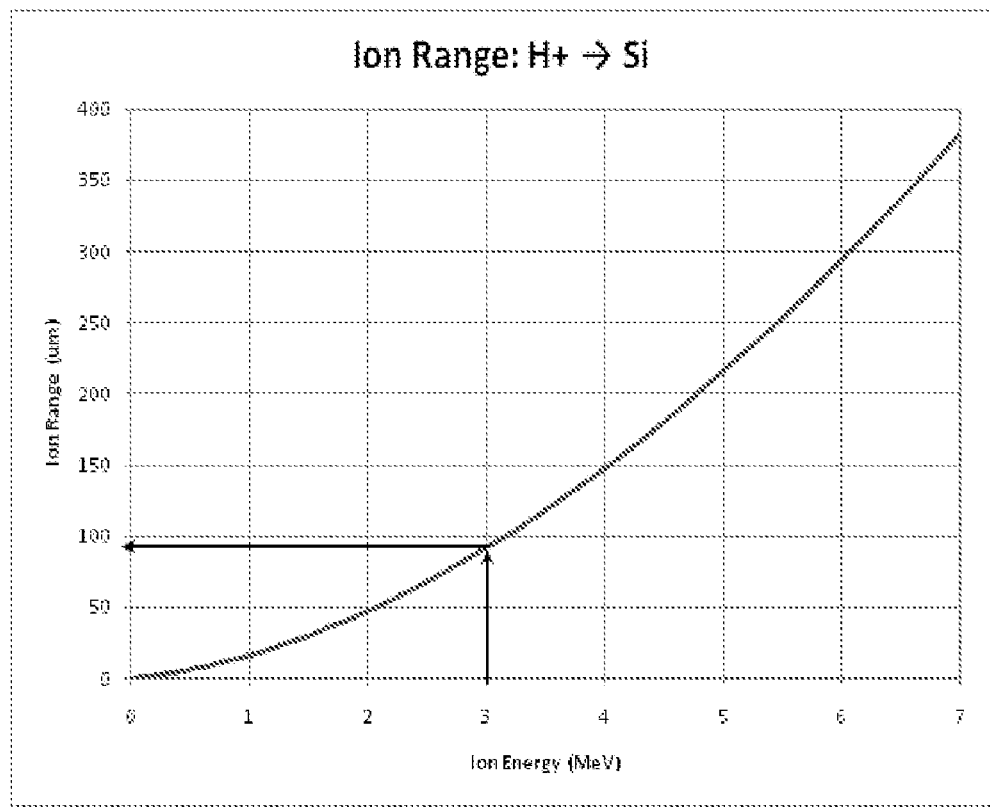
FIG. 1 is a plot of proton range in silicon as a function of energy from SRIM.

| DRAWING REFERENCE NUMERALS | |
|---|---|
| 10 | Ion Beam |
| 20 | Ion Beam Delivery Tube |
| 30a, b | Target Vacuum Chamber (a: Cover; b: Base) |
| 35 | Pump port |
| 40 | Slice stacker |
| 42 | Slice transfer arm |
| 45 | Slice stack |
| 50 | Workpiece stacker |
| 52 | Workpiece transfer arm |
| 55 | Workpiece |
| 60a, b | Anneal heater module |
| 70 | Cleave module |
| 80 | Second Carousel |
| 90 | Atmospheric Swapper |
| 100 | First Carousel |
| 105 | First Carousel Workpiece Support |
| 110 | Vacuum Swapper |
| 115 | Vacuum Swapper Arm |
| 120 | Plunger |
| 130 | Pumping channel |
| 140 | Vacuum-side o-ring groove |
| 142 | Atmosphere-side o-ring groove |
| 144 | Gap Filler Piston O-Ring Groove |
| 150 | Gap Filler Piston |
| 160 | Gap Filler Motor |
| 170 | Gap Filler Lead Screw |
| 200 | Load Lock |

| DRAWING REFERENCE NUMERALS | |
|---|---|
| 205 | Batch Load Lock |
| 207 | Workpiece Buffer |
| 210 | Rough Vacuum Plenum |
| 220 | High Vacuum Plenum |
| 230 | High Vacuum Pump |
| 240 | Rough Vacuum Valve |
| 250 | High Vacuum Valve |
| 260 | Rough Pump |

DETAILED DESCRIPTION OF THE INVENTION

As discussed in the background section, FIG. 1 shows, for reference, a plot of the range of hydrogen ions in silicon as a function of ion energy. It is plotted from values produced by the publicly available ion simulation software SRIM.

Figure 2A:
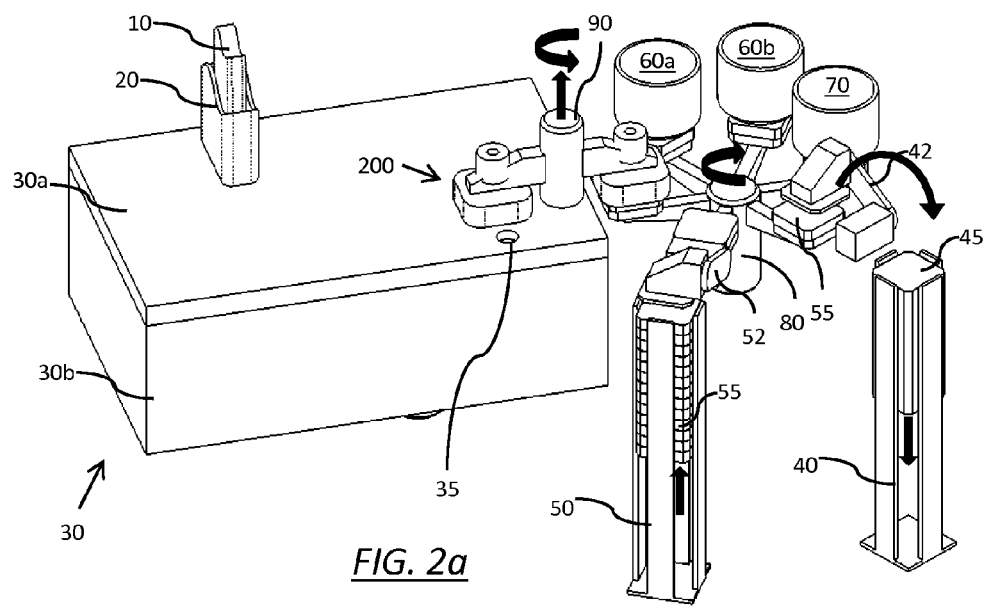
FIGS. 2a and 2b are perspective views of an embodiment of the ion-cut processing machine, and are identical except FIG. 2b has the target vacuum chamber 30 hidden to show internal elements.
Figure 2B:
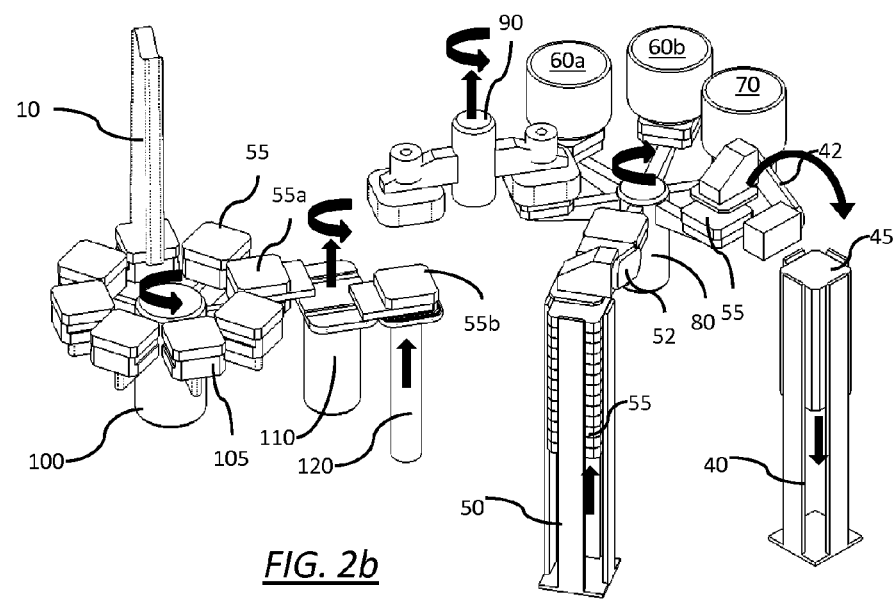

FIGS. 2a and 2b show one preferred embodiment of the ion-cut processing system. FIGS. 2a and 2b are identical except FIG. 2b has the vacuum chamber hidden to show the internal elements. In these figures some elements and details such as support structures are not shown or are simplified for clarity. Referring to FIG. 2a, ion beam 10 enters the target vacuum chamber 30 via beam tube 20 which is coupled to an ion source, accelerator, and beam delivery and scanning optics (not shown), all of which are generally under vacuum. The target vacuum chamber 30 comprises a vacuum chamber cover 30a and vacuum chamber base 30b.

Referring now to FIG. 2b, with the target vacuum chamber 30 hidden to expose the internal features, a plurality of workpieces 55 is supported on first carousel 100. Some of the workpieces 55 are not numbered for clarity. At the instant shown in the figure, ion beam 10 strikes one of the workpieces 55. In the illustrated embodiment there are 8 workpieces 55 supported on 8 first carousel workpieces supports 105 of wheel-shaped first carousel 100. First carousel 100 is adapted to rotate as indicated by an arrow thereby passing the workpieces 55 sequentially under ion beam 10 and exposing them thereto.

Vacuum swapper 110 is adapted to swap a fully implanted workpiece 55a on first carousel 100 with another fresh workpiece 55b located on plunger 120. The term 'fresh' refers here to a workpiece that may have been partially sliced but is ready to be implanted, while 'new' refers to a workpiece that is of the full thickness and has never been sliced. Swapper 110 will be described in more detail later. Note that at the instant shown, an arm of vacuum swapper 110 is engaging first carousel 100, preventing it from advancing while simultaneously ion beam 10 is striking a workpiece. This is for illustrative purposes: in most actual situations, ion beam 10, would be turned off, or directed off the workpiece during a swap to prevent over-dosing and over-heating the workpiece.

We define one 'implant cycle' to be the steps of:
 i. starting with carousel 100 stationary and a workpiece support 105 adjacent to swapper 110
 ii. accelerating first carousel 100
 iii. exposing workpieces 55 to ion beam 10
 iv. decelerating first carousel 100 to a stop with a workpiece support adjacent to swapper 110
 v. swapping two of workpieces 55 using vacuum swapper 110

Let M denote the number of workpieces 55 and workpiece supports 105 on first carousel 100. In one implant cycle, first carousel will have advanced by a total of N workpiece support positions. In general N may be greater than, less than, or equal to M, where N=M corresponds to one full revolution of first carousel 100. In one preferred embodiment M and N are relatively prime integers (co-primes). That is they must have no common factors except 1. For example, the case of N=17 and M=8, which are relative primes, would correspond to the advancement of first carousel 100 by 2⅛ cycles or two complete cycles plus one workpiece support position. When N and M are co-prime, first carousel 100 will position a different workpiece support 105 adjacent to vacuum swapper 110 every time carousel 100 stops until, after M implant cycles all M workpiece supports 105 have been addressed by the vacuum swapper 110. Furthermore, each workpiece 55 will reside on first carousel 100 for M implant cycles before being swapped out. In any particular implant cycle, each workpiece may receive differing exposure to the ion beam, since some workpieces may pass under the ion beam while the first carousel is still accelerating, for example. By the time the workpiece is removed after M implant cycles, it will have occupied every possible starting position on the carousel; therefore every workpiece will receive substantially identical ion doses and have substantially identical thermal histories.

Note that N may also be less than M. For example, the case of N=7, M=8 will effectively result in a backward shift by one wafer position after each implant cycle. It is preferable that N be greater than 1 in order to achieve effective spreading of heat over multiple workpieces, however it is possible, in some circumstances where heating is not a severe problem or where one wishes to intentionally heat the workpiece with the ion beam, that the system operate with N=1.

Recognizing that, for the ion-cut application, the workpieces gradually grow thinner as they are sliced and that this leads to a reduction in their thermal capacitance and thermal resistance over time, leading to changes in the surface temperature history of the workpieces, even for fixed ion dose. In one embodiment of the invention, the system changes N (while preferably maintaining the requirement of coprimality) in order to compensate for these thermal effects. Assuming a fixed beam current and implant cycle time, lower N requires a correspondingly lower workpiece speed to achieve a constant dose, but will produce higher surface temperatures. For example, after processing some multiple of M workpieces with N=17 and M=8, the recipe could be changed to N=25 or N=9 without affecting the workpiece handling sequence or the total dose, only the workpiece temperature would change as a result of the changed workpiece velocity.

Additionally, in most implant processes it is generally required that the total ion dose be well controlled. Natural variations in ion beam current can be compensated by measuring the beam current with a faraday cup and adjusting the workpiece velocity proportionately, while keeping N constant. This will result in small variations in implant cycle time since the first carousel 100 must advance a fixed 'distance' N at varying speeds.

This invention advantageously spreads beam power and heat flux across multiple workpieces thereby limiting excessive workpiece temperature, yet it also takes in and puts out individual workpieces, rather than an entire batch, thereby permitting simpler, less expensive upstream and downstream workpiece handling and processing systems. The present design and mode of operation are believed to be novel and advantageously combine the key benefits of both batch and serial implantation equipment.

In the preferred embodiment, the first carousel 100 rotates workpieces 55 smoothly and continuously under ion beam 10. In an alternate embodiment, first carousel 100 may operate in an indexed, or step-and-dwell fashion wherein workpieces 55 are stationary for a short period during which one or more receives treatment by ion beam 10. In this step-and-dwell mode of operation, the ion beam would be spread to uniformly cover the area of one or more workpieces. The steps ii, iii, and iv of the implant cycle set forth above would be altered accordingly to reflect step-and-dwell operation between workpiece swaps.

Following a swap by vacuum swapper 110, the implanted workpiece 55*a* will then be located on plunger 120 and the fresh workpiece 55*b* will have been introduced to carousel 100. Plunger 120 raises its workpiece into a load lock chamber which will be described more fully later. The load lock allows the implanted workpiece to pass through the envelope of the vacuum chamber into atmosphere. Once in atmosphere, atmospheric swapper 90 swaps the implanted workpiece from the load lock with a fresh workpiece from second carousel 80.

Second carousel 80 is also adapted to support a plurality of workpieces 55. Six are shown in the embodiment illustrated in FIG. 2. Second carousel 80 indexes or steps its workpieces through a sequence of process stations. After each time atmospheric swapper 90 transfers an implanted workpiece 55 onto second carousel 80, second carousel 80 advances its workpieces to the next process station. Accordingly, second carousel 80 will index with a period equal to the time of one implant cycle. In the embodiment illustrated in FIG. 2, the process stations after swapper 90 are annealing heaters 60*a* and 60*b*, followed by cleaving module 70 which separates a slice from the top surface of the workpiece, followed by slice transfer arm 42 which moves the freed slice to the top slice stack, followed by workpiece transfer arm 52 which removes the stub-end or remnant of a fully processed workpiece and replaces it with a new workpiece from the top of workpiece stack 55. Note that the mechanism and receptacle for handling the stub-ends or remnant of fully sliced workpieces is not illustrated here for simplicity, but is simple matter to provide a single rotary transfer arm adapted to transfer the stub-end or remnant of a fully processed workpiece to a third 'stub-end stack' and pick a new workpiece from the top of workpiece stacker 50 and place it on second carousel 80.

It is particularly undesirable to expose the workpiece supports 105 of first carousel 100 to direct strike by ion beam 10. Therefore, during the start of operation of the machine, and at the end of a production run, otherwise empty workpiece supports on one or both carousels and other positions may be populated to fill the process pipeline with workpieces. Since these workpieces will not receive full treatment by the ion beam, reusable 'dummy' workpieces may be used to protect the workpiece supports and to otherwise fill empty workpiece positions until the pipeline is filled. In reference to the illustrated embodiment of FIG. 2*a*, these dummy workpieces could be handled and stored by simply adapting the mechanisms for handling new and stub-end workpieces, as described earlier. Specifically, a fourth 'dummy stack' (not shown) would supply and receive dummy workpieces which would be transferred preferably using a single transfer arm for the dummy stack, the stub-end stack and the new workpiece stack 50. Non-productive dummy workpieces may also be used to prevent the mixing on first carousel 100 of workpieces that have been fully sliced with other that are new, as may occur for example just after a group of workpieces have been fully sliced.

Outgoing slices are held in a hopper or slice stacker 40 which preferably comprises a lift mechanism adapted for gradually moving the stack downward as it slices are added, as indicated by the arrow, thereby maintaining the top slice at a fixed height so that new slices are deposited in a repeatable position by slice transfer arm 42. Similarly, incoming new workpieces 55 are held in a hopper or workpiece stacker 50 which preferably comprises a lift mechanism adapted for gradually moving the stack upward as workpieces are removed, as indicated by the arrow, thereby maintaining the top workpiece at a fixed height so that it may be picked from a repeatable position by workpiece transfer arm 52.

In the illustrated embodiment, second carousel 80 supports workpieces 55 and may optionally cool or heat them from below. An alternate embodiment may have the workpieces supported on specialized pedestals dedicated and fixed to each of the various process stations, and carousel 80 may only serve to pick up the workpieces 55 and transfer them to the subsequent process station.

The present invention is highly flexible and scalable, and will accommodate a wide variety of post-implant process sequences. For example, it is generally desirable that the system throughput be limited by the available ion beam current since the ion generation and delivery system is generally the most costly component of the system. If the annealing process is longer than one implant cycle, it is simple and inexpensive to provide two (or more) annealing station as illustrated by 60a and 60b, thereby preventing the anneal process from limiting the throughput. Alternately, if ion beam 10 itself produces sufficient annealing of the workpieces then second carousel 80 may be simplified by eliminating the annealing modules entirely. Similarly, if the cleaving process comprises a mechanical peeling of the slice, then cleave module 70 and slice transfer arm 42 may naturally be combined into a single process station. Clearly, this dual carousel system allows processes to be changed easily by changing the number or function the relatively small, low-cost modules on second carousel 80.

An alternate embodiment directed at layer transfer, such as silicon on insulator substrates, wherein workpieces are bonded to a 'handle' substrate prior to cleaving can also easily be implemented. Such an embodiment may, for example, include a third carousel, turret, or swapper carrying handle substrates toward second carousel 80 wherein handle substrates are bonded to the top surface of workpieces 55 and then workpiece 55 is cleaved, the remainder of workpiece 55 continuing to cycle as before, while the bonded handle and slice are withdrawn. Yet other embodiments may include process stations for cleaning or surface preparation or in-situ process metrology.

In contrast to systems that process workpieces in parallel in batches or two dimensional arrays of workpieces on carriers, the serial processing here allows easy access to individual workpieces and reduces the mechanical complexity since handling mechanisms, process modules and sensing and process controls need not be duplicated for parallel operation.

For example, in measuring the temperature of the workpieces 55, the present invention allows a single infrared temperature sensor to be located over the workpieces 55 on first carousel 100 whereby the carousel motion allows all workpieces to be sensed, whereas a 2d array of workpieces requires a plurality of sensors. Similarly, the relatively localized ion beam spot allows the ion beam dump and ion beam current measurement faraday cup to be relatively compact, deep and to have good line-of-sight isolation from the workpieces. Large, area-covering ion beams are difficult to dump, to measure, and to keep uniform in two dimensions.

In the embodiment illustrated in FIG. 2, ion beam 10 is spread to cover the full width of the workpiece 55 in at least the direction perpendicular to the motion of the workpieces (the radial direction in this embodiment) thereby forming a ribbon or curtain-shaped ion beam. This spreading may be accomplished by a variety of means known in the art including: i) rapidly raster-scanning the beam back and forth using AC electromagnets, ii) rapidly raster-scanning the beam back and forth using AC electrostatic deflector plates, iii) statically spreading the beam using DC ion-optical elements. iv) moving the workpieces in two dimensions, for example by slowly moving the entire first carousel 100 in a radial direction in addition to a faster rotary motion.

In some cases it may also be necessary to collimate the ion beam using magnetic or electrostatic elements so that the beam is substantially parallel upon striking the workpieces. It may also be advantageous, for very narrow ion beams, to spread the ion beam additionally in the direction parallel to the direction of motion of the workpieces 55 so as to minimize localized heating of the workpieces 55.

In the illustrated embodiment of FIG. 2, the workpieces move in circles wherein the surface velocity of material is proportional to radius. In such a case it is necessary to compensate the radial current density of the ion beam in order to produce a uniform dose of ions, independent of radius. This may be done easily using the radial ion beam scanning system and controlling the raster-scanning speed to be substantially proportional to 1/r. Alternately, the ion beam 10 may scanned in two dimensions to uniformly expose a wedge-shaped or arc-shaped region, two opposing sides of which are co-linear with the center of first carousel 100, thereby achieving uniform dosing.

An alternate embodiment may use a carousel 100 which cycles the workpieces 55 such that they move in a straight line as they pass under the ion beam 10. For example, the carousel 100 could be a conveyor system with an racetrack-shaped path. This approach would eliminate the need for radial compensation of the ion beam current density and would provide uniform dose and more uniform thermal treatment of the workpiece surface.

During steps i, ii, iv, and v of the implant cycle, first carousel 100 will be accelerating, decelerating, or will be stopped. One of the significant advantages of the present invention is that, during continuous operation, every fully implanted workpiece 55 will have occupied each carousel position once (relative to the ion beam position) at swap, and therefore every workpiece receives identical treatment. Therefore is it possible to apply the ion beam 10 to the workpieces even as first carousel 100 is accelerating or decelerating. This improves throughput since acceleration and deceleration time is not wasted. Clearly however, leaving one workpiece stationary, or nearly so, under the ion beam 10 during a swap may cause undesirable heating to that workpiece. To remedy this, the ion beam may be positioned so as to fall in the space between two workpieces when performing a vacuum swap. Alternately, the ion beam 10 may be switched off or redirected to a beam dump during these times.

Returning now to FIG. 2b, the first carousel 100 is provided with workpiece supports 105 which are cooled with a coolant fluid flowing through internal manifolds. The workpiece supports 105 are adapted to receive the workpieces 55 and secure them and are preferably adapted to enhance the thermal coupling between the workpiece support 105 and the workpiece 55, thereby cooling the workpiece 55.

Many possible securing means are known in ion implanter art and semiconductor process equipment art and include mechanical clamps, centrifugal force, electrostatic chucks, gravity etc. Furthermore, enhancement of the thermal conductivity between a workpiece and a support is a common problem in semiconductor and vacuum equipment industries for which there is extensive prior art. Most common means are to supply low pressure 'backside' gas to the interface between the two parts and optionally to provide a light peripheral seal to minimize escape of backside gas. Additionally, a thermally conductive compliant material, such as a filled silicone rubber, may be disposed on the support.

Figure 3:
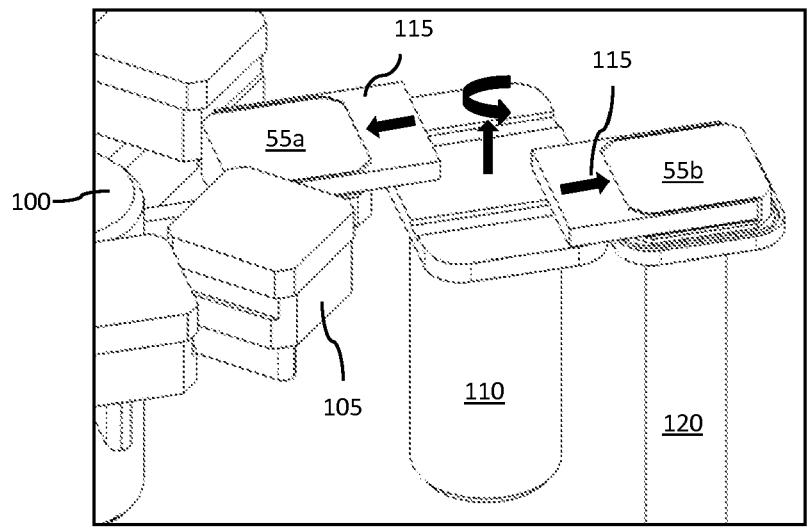
FIG. 3 is a detail view of a vacuum swapper.

FIG. 3 shows a detail view of the vacuum swapper 110. Dual vacuum swapper arms 115 extend to the position shown, in the direction indicated by the arrows, engaging and gripping the workpieces 55a and 55b. Vacuum swapper 110 moves up axially, lifting both workpieces 55a and 55b, then rotates 180 degrees and moves down again releasing the swapped workpieces 55a and 55b on plunger 120 and first carousel 100, respectively. Vacuum swapper arms 115 then retract allowing plunger 120 and first carousel 100 to move freely.

Figure 4:
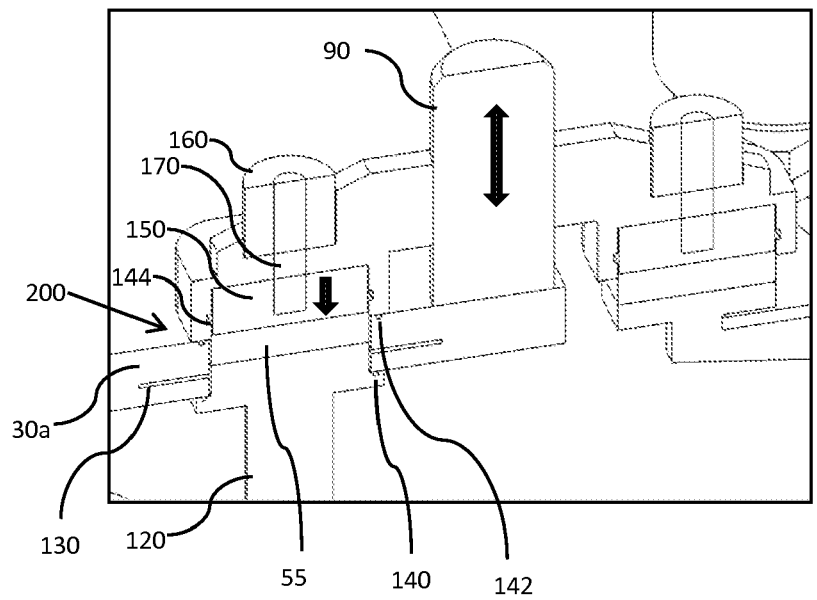
FIG. 4 is a detail section view of the load lock and atmospheric swapper.

FIG. 4 shows a detail sectional view of the load lock 200 and atmospheric swapper 90. The term load lock is widely known in the art. In general, a load lock is a device for transferring items in or out of a vacuum chamber without unsealing and admitting significant amounts of gas to the vacuum chamber. In general, a load lock comprises a void or volume or chamber adapted for receiving a workpiece and comprising two sealable openings; one vacuum-side opening coupled to the volume of vacuum chamber and one atmosphere-side opening coupled to atmosphere. It also comprises a vacuum pumping and venting system to control the pressure inside the load lock independently of the vacuum chamber. To admit an item to the vacuum chamber, the item is placed in the load lock while the vacuum-side opening is sealed. Next, the atmosphere-side opening is sealed, the load lock is pumped out to a pressure at or close to the pressure of the vacuum chamber, the vacuum-side opening is unsealed and the item is moved into the vacuum chamber. To remove an item, the aforementioned process operates in reverse.

In the illustrated embodiment of FIG. 4, load lock 200 comprises a hole entirely through vacuum chamber cover 30a. The vacuum-side opening is sealed or unsealed by the up or down actuation, respectively, of plunger 120. A vacuum tight first seal is made by an o-ring disposed in vacuum-side o-ring groove 140 surrounding the vacuum-side opening. Similarly, the atmosphere-side opening is sealed or unsealed by the down or up actuation of atmospheric swapper 90, as indicated by the double-ended arrow. A vacuum tight seal is made by an o-ring disposed in atmosphere-side o-ring groove 142. In an alternate embodiment, the arms of atmospheric swapper 90 may actuate up and down independently so as to permit the load lock to be sealed while allowing the opposing arm to be moved up and away from the rotating second carousel 80. Additional openings into the load lock volume are provided to allow the volume to be pumped out and vented to atmosphere. Radial pumping channel 130 (FIG. 2b) is coupled to pump port 35 (FIG. 2a) which is further coupled to a valve and pump enabling the load lock volume to be evacuated. The plumbing for venting the load lock is not illustrated here for clarity.

The cyclic operation of the load lock begins with plunger 120 down and supporting an implanted workpiece 55 and with swapper 90 sealing the atmosphere-side opening of the load lock. Next plunger 120 is raised, carrying workpiece 55 into load lock 200 and simultaneously sealing the vacuum-side opening. Next, the load lock is vented by admitting gas until atmospheric pressure is attained and atmospheric swapper 90 grips or engages workpiece 55. The atmospheric swapper's gripping mechanism, not illustrated here for clarity, may be a mechanical clamping type, or alternately, may be a vacuum suction or Bernoulli-type gripper that engages the top surface of the workpiece 55. Next, atmospheric swapper 90, or at least its appropriate arm, is raised, and then rotated 180 degrees carrying implanted workpiece 55 out of the load lock and replacing it with a fresh workpiece. Next, atmospheric swapper 90 is lowered, sealing the air side. Next, load lock 200 is pumped down to an acceptably low pressure and swapper 90 releases the fresh workpiece 55 onto the plunger. Finally, plunger 120 moves down, carrying the fresh workpiece 55 to vacuum swapper 110 which then performs its own swap, already discussed, and the cycle repeats.

It is important that the load lock operate at very high speed since the workpieces will flow through the load lock individually and therefore it must complete a full pump-vent cycle for every workpiece processed. The load lock described above is well-suited to achieve this since the internal volume of the load lock may be kept to an absolute minimum. The volume of gas surrounding workpiece 55 inside the load lock is minimized by providing load lock side walls, in this case the opening in chamber cover 30, which conform closely to the shape of the workpiece. The bottom and top walls of load lock 200, in this case formed by plunger 120 and atmospheric swapper 90, respectively, are also spaced closely to the surface of workpiece 55 thereby excluding all but a small volume of gas surrounding the workpiece 55.

A further improvement in the load lock design is applicable to the case of ion-slicing of workpieces such as silicon ingots. In such case, the workpiece 55 gradually grows smaller as it is progressively sliced. The load lock 200 is adapted to have an internal volume which progressively grows smaller as well. This may be accomplished by means of a bellows or preferably a sealed moveable wall as illustrated in FIG. 4. Gap filler piston 150 is adapted to move downward as workpiece 55 grows thinner. Gap filler piston 150 may be sealed to atmospheric swapper body by means of an o-ring disposed in gap-filler piston o-ring groove 144 and may be driven by lead screw 170, turned by motor 160, for example.

Figure 5:
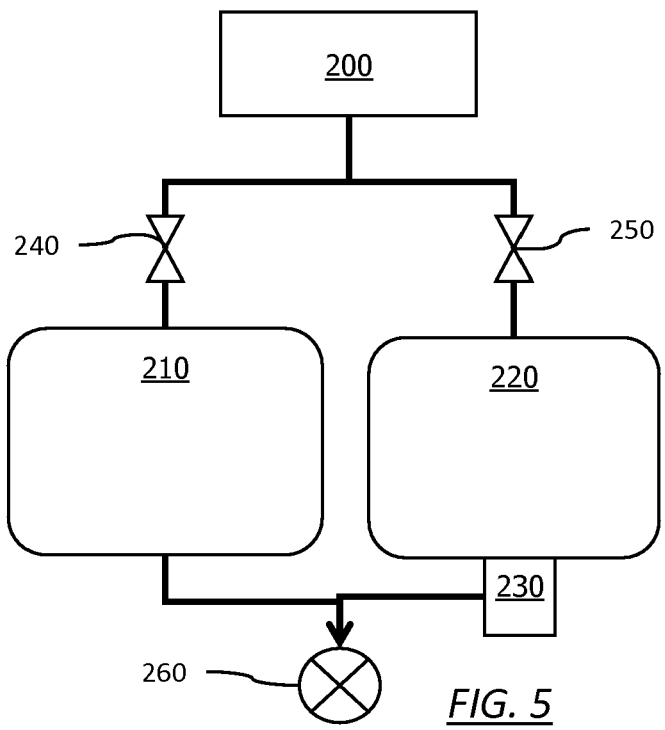
FIG. 5 is a schematic view of the load lock vacuum system

FIG. 5 shows a schematic view of the load lock vacuum pumping system further adapted for very high throughput. Load lock volume 200 is coupled to rough vacuum plenum 210 through high conductance conduits and high conductance rough vacuum valve 240. Rough vacuum plenum 210 is pumped continuously by roughing pump 260. The volume of rough vacuum plenum 210 is selected to be much larger than the volume of gas in load lock 200. When valve 240 is opened, gas in load lock volume 200 will be rapidly drawn into plenum 210 until the pressures are roughly equal. For the preferred embodiment case where the volume of plenum, $V_P$ is much larger than the volume of the load lock, $V_{LL}$, the resulting pressure will be approximately $$p \sim p_P + \frac{V_{LL}}{V_P} p_{LL}$$

where $p_P$ is the initial pressure in the plenum and $p_{LL}$ is the initial pressure in the load lock and is generally one bar or $p_{LL}$=101323 Pa. Assuming, for example, that $V_P$=1×10$^6$ cc, $V_{LL}$=50 cc, $p_P$=6 Pa, then the resulting pressure will be approximately 11 Pa, which can be reached very rapidly.

An optional high vacuum plenum 220, also coupled to load lock volume 200 through high conductance high vacuum valve 250, may be used to further reduce the load lock pressure. High vacuum plenum 220 is continuously pumped by a high vacuum pump such as a turbomolecular pump 230 connected to roughing pump 260 or a cryopump. After the pressure in the load lock has fallen to some relatively low pressure as a result of the opening of valve 240, valve 240 is closed and valve 250 is opened, coupling load lock volume 200 to high vacuum plenum 220, thereby rapidly reducing the pressure in load lock even further. Using a similar volume ratio as the above example, the pressure can be reduced to the high vacuum range of the order of 0.001 Pa. Opening the load lock at this point will introduce very little gas into the relatively large target vacuum chamber 30, thereby causing a negligible increase in the pressure in chamber 30.

Plenums 210 and 220 act to smooth out the spikes in pressure seen at the pump inlets, maintaining the pressure at the respective pump inlets very close to the time-average pressure, rather than exposing the pumps to periodic pressure bursts every time the load lock is pumped out. This above technique combining an ultra-low volume load lock with pumping plenums is highly advantageous: first because it allows the load lock to be pumped very rapidly; and second because it enables the pumps to operate continuously in their optimum operating regime, enabling the system designer to size the pumps to handle the average gas flow rather than selecting larger, more expensive pumps to handle peak pressures.

Figure 6:
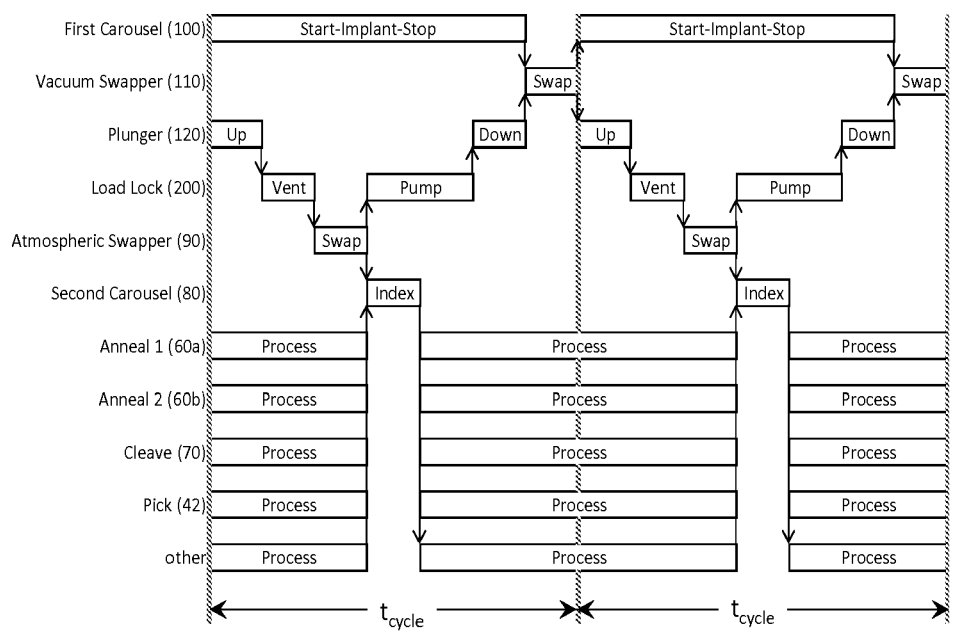
FIG. 6 is a chart showing a typical processing sequence.

FIG. 6 shows the sequence of operations of a preferred ion-cut embodiment of the invention. Shown in the first column are the various modules that comprise the ion-cut processing system. Displayed horizontally are the various states or processes of each module. Vertical arrows indicate cause and effect: the process at the head of the arrow may proceed only after the process at the tail of the arrow is complete. In FIG. 6 two complete cycles of the system are shown between heavy vertical lines. Each cycle takes a time $t_{cycle}$.

The cycle begins just after a fresh workpiece has been placed on first carousel 100. The carousel accelerates, implants, and stops, allowing the vacuum swapper 110 to swap workpieces after which the cycle may repeat. The start of a cycle also triggers plunger 120 to move up, then the load lock 200 can vent, then the atmospheric swapper 90 can swap, then the load lock 200 can pump out, then plunger 120 can move down again, allowing the vacuum swapper 110 to swap. It can be seen that vacuum swapper 110 may only swap after both first carousel 100 has stopped and plunger 120 has moved down. The completion of a swap by atmospheric swapper 90 triggers the indexing of second carousel 80. After the indexing, a comparatively long period of time is available for each of the non-implant process modules such as Anneal 1 (60a), anneal 2 (60b), cleave (70), pick (42), and others, to operate in parallel.

In some cases it may be possible to perform the ion-cut process using process modules that operate generally in vacuum. For example, annealing may be done in vacuum and the cleave operation may done using a pulse of energy or heat. In such case, an alternate embodiment of the ion-cut apparatus may be used, wherein second carousel 80 is located with first carousel 100 inside vacuum chamber 30. In that embodiment, workpieces are transferred between carousels preferably using a single, simple vacuum swapper 110 and outgoing slices may themselves be transferred to atmosphere through a high speed load lock.

An embodiment of the present invention directed at semiconductor ion implantation (doping) would not generally require a second carousel. In that case, the first carousel 100 would operate generally as described above but with silicon wafers entering and leaving the system at the point of load lock 200 or atmospheric swapper 90, wherein the wafers would be transferred to and from cassettes via conventional robotics and front-end modules widely known and highly standardized in the industry.

In the case of ion implantation for microchip fabrication (doping), the batch size has generally been selected with reference to the standardized number of wafers in wafer transport cassettes. Specifically, microchip manufacturing almost universally uses cassettes of 25 wafers, therefore the batch size in commercial implanters has generally been either 13 or 17 wafers corresponding to roughly half a cassette or ⅔ cassette respectively. Since the first carousel 100 of the present invention accepts and emits workpieces serially, there is no need to select M with reference to the standard cassette size. Therefore the number M of workpieces on first carousel 100 may be chosen to be a relatively small number, advantageously allowing the use of a small carousel (or wheel) with low inertia. In addition to minimizing the amount of work-in-process or material in the machine, a small batch size allows the carousel to be accelerated and decelerated rapidly, thereby improving throughput. The serial flow of implanted workpieces is highly advantageous, particularly in chip-making factories that produce a wide variety of different products for different customers and where small and partial production lots do not conform well to standard cassette sizes.

Yet another embodiment of the ion-cut processing apparatus may retain the dual-carousel architecture yet process the workpieces 55 in batches of M workpieces. This embodiment sacrifices some aforementioned advantages of serial processing, however in certain cases, such as when the use of dummy workpieces is undesirable, it may be necessary. For a batch-mode of operation, the first carousel 100 would be fully populated with workpieces 55 prior to exposure to ion beam 10. Then all the loaded workpieces would be implanted with the full dose for a time approximately M times as long as the implant cycle of the serial case. Then all workpieces on first carousel 100 would be unloaded to a batch load lock capable of receiving a full set of M workpieces. Meanwhile second carousel 80 would operate as in the serial embodiment, receiving workpieces 55 one at a time from a batch load lock onto second carousel 80 and advancing the workpieces 55 through each process. In most cases it will be preferable, to prevent throughput bottlenecks, to use two batch load locks: one feeding first carousel 100 and the other feeding second carousel 80. The two batch load locks may alternate roles on each full cycle of M workpieces.

Figure 7A:
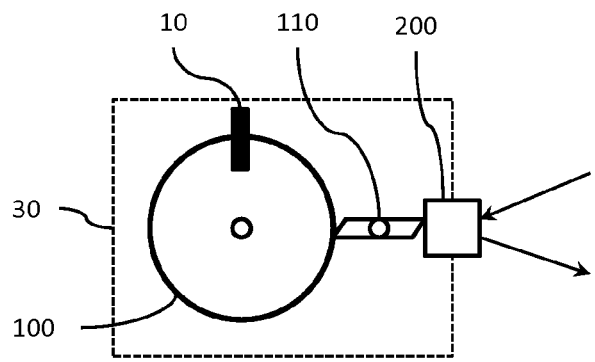
FIGS. 7a-f are schematic representations of several different embodiments of machine architecture.
Figure 7B:
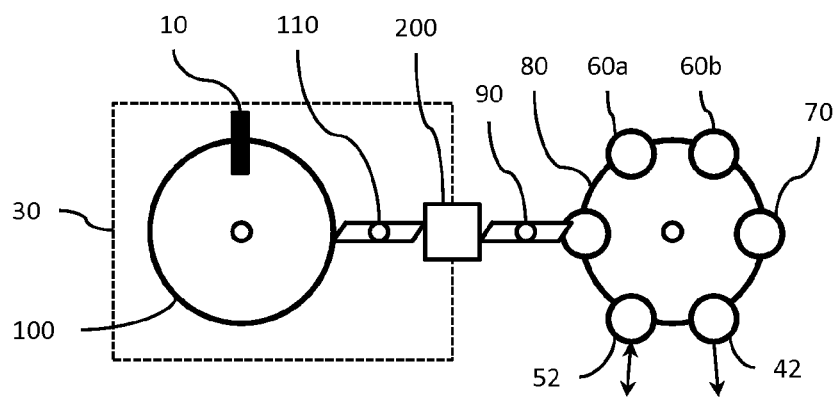
Figure 7C:
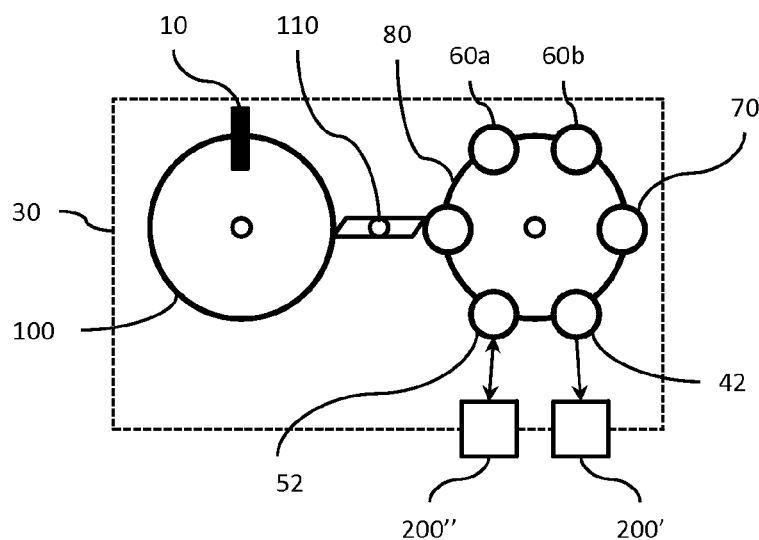

FIGS. 7a-7f illustrate schematically some embodiments of the machine architecture. These figures are generally self-explanatory as the details have been largely discussed above, and like reference numbers substantially refer to like parts already discussed. FIGS. 7a, 7b, and 7c represent embodiments of the serial type, wherein N and M are preferably co-prime. FIG. 7a is an embodiment directed at ion implantation for semiconductor manufacturing, therefore having no second process carousel. FIG. 7b is an embodiment of the serial ion-cut architecture wherein second carousel 80 further processes the workpieces (not shown) and returns then to first carousel 100. FIG. 7c is another embodiment serial ion-cut architecture wherein second carousel 80 is located in vacuum. Load lock 200' is provided for extracting slices. Load lock 200" is provided for removal and insertion of stub-end and fresh workpieces, respectively.

Figure 7D:
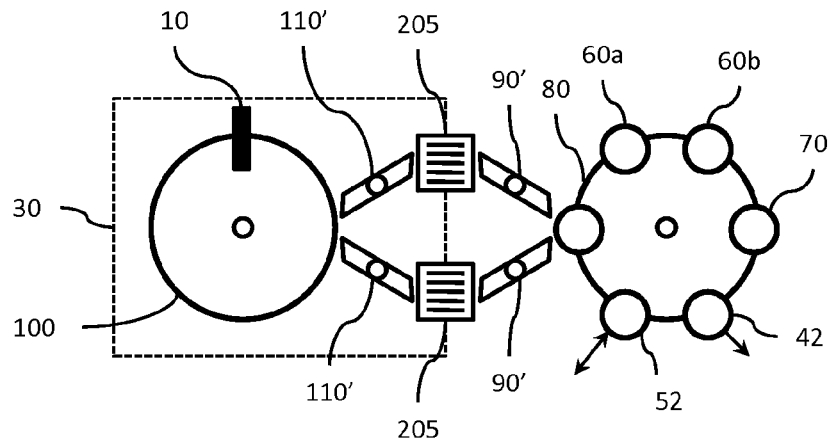
Figure 7E:
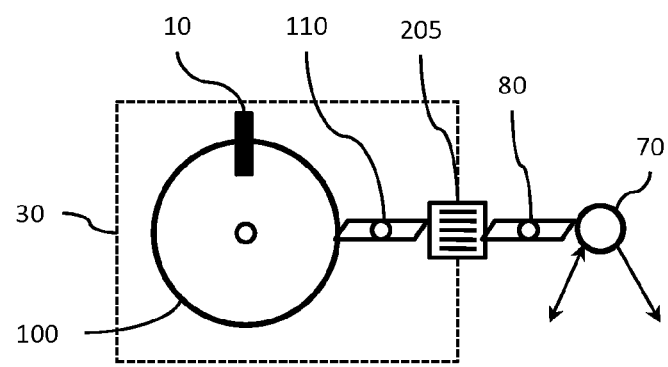
Figure 7F:
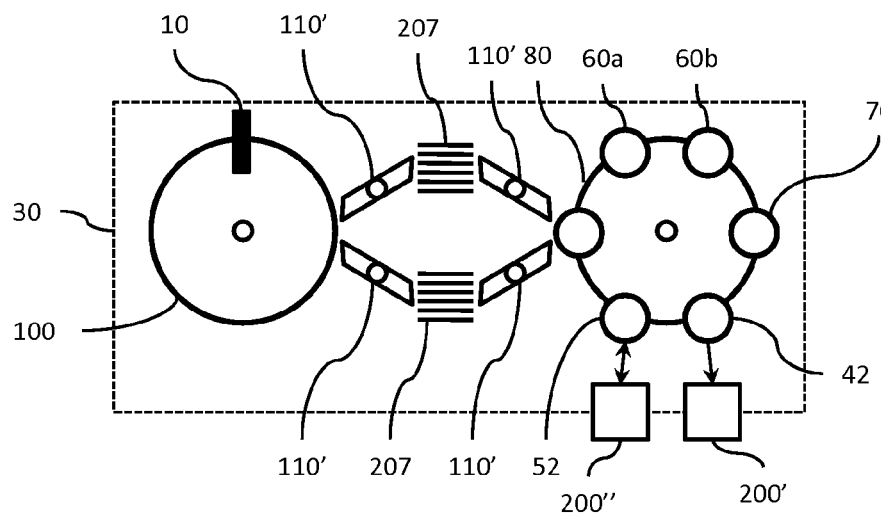

FIGS. 7d, 7e, and 7f represent embodiments of the batch-type ion-cut architecture, wherein a dual carousel architecture is employed, but workpieces are disposed on, and removed from the first carousel 100 in a batch: That is, all M workpieces on first carousel 100 are implanted fully, and then all are exchanged with fresh workpieces. Note that even with batch operation of the implant process, the machine retains the advantages of serial processing in the subsequent process steps on second carousel 80, such as annealing and cleaving, as well as the flow of slices out of the machine itself toward downstream processes.

In FIG. 7d dual batch load locks 205, each capable of holding M workpieces are used to pass workpieces in and out of vacuum. The batch load locks 205 may be loaded and unloaded on the vacuum-side by vacuum swappers 110' and on the atmospheric-side by atmospheric swappers 90'. Each batch load lock 205 may comprise a elevator inside a load lock chamber adapted for supporting plural workpieces and for moving the workpieces up and down whereby each workpiece may selectively be placed adjacent to doors on each side of the load lock chamber and positioned at a plane accessible by swappers 110' and 90'. Embodiments having only a single batch load lock 205 are also possible, as are embodiments where dual swappers 110' (and 90') are replaced by a single robotic device adapted for addressing two load locks and a carousel. In the dual load lock configuration, one load lock may be dedicated to removing implanted workpieces from first carousel 100, and the other dedicated to delivering fresh workpieces to first carousel 100. Alternately, the load locks 205 may be operated symmetrically, both transferring workpieces in via swapping, as illustrated.

A similar but highly simplified embodiment is shown in FIG. 7e wherein carousel 80 is reduced to a simple 2-position swapper: one position addressing single load lock 205 directly, and the other addressing a single cleaving module 70. Slices, stub-ends, dummy workpieces and new workpieces may all be transferred in and out of the machine at cleave module 70, as represented by the arrows. Note that a similar highly simplified implementation of second carousel 80 could be employed in the embodiments of FIG. 7b and FIG. 7c.

FIG. 7f shows an embodiment that is a hybrid of the batch system of FIG. 7d with the second-carousel-in-vacuum system of FIG. 7c. In this case batch load locks between the carousels are not necessary and are replaced by simpler in-vacuum workpiece storage buffers 207.

In the preceding detailed description and figures, the invention is described with reference to specific embodiments thereof. It will, however, be evident that various modifications and changes may be made thereto without departing from the broader spirit and scope of the invention. The specification and drawings are, accordingly, to be regarded in an illustrative rather than a restrictive sense.

I claim:

1. A machine for slicing workpieces with an ion beam, comprising:
   a. a target vacuum chamber,
   b. an ion beam of preselected energy,
   c. a first carousel inside said target vacuum chamber adapted for circulating a plurality of workpieces, numbering M, through said ion beam,
   d. a plurality of stations comprising at least:
      i. a workpiece swapping station,
      ii. a cleaving station,
   e. a second carousel adapted for circulating workpieces sequentially from station to station,
   f. a workpiece swapping means operable for transferring an implanted workpiece from said first carousel to said workpiece swapping station of said second carousel, and transferring a fresh workpiece from workpiece swapping station of said second carousel to said first carousel,
   wherein:
      i. said first carousel is repeatedly advanced by N workpieces, exposing some workpieces to said ion beam and implanting ions in a layer at a preselected depth therein,
      ii. following each advancement, said workpiece swapping means transfers an implanted workpiece from said first carousel to said workpiece swapping station of said second carousel, and transfers a fresh workpiece from said workpiece swapping station of said second carousel to said first carousel,
      iii. upon receiving said implanted workpiece, said second carousel is advanced, moving each of its workpieces to a subsequent station, and thereby moving one workpiece to said cleaving station, wherein workpiece material above said layer is separated from the underlying workpiece, thereby forming a slice,
   whereby each workpiece is repeatedly implanted and cleaved, producing a plurality of slices.

2. The machine of claim 1 wherein N and M are co-prime, whereby, in steady-state operation, each said implanted workpiece will receive substantially identical treatment by said ion beam.

3. The machine of claim 1 wherein said second carousel is located outside said target vacuum chamber, said workpiece swapping means comprising:
   a. a load lock coupled to said target vacuum chamber,
   b. a vacuum swapping means disposed inside said target chamber between said first carousel and said load lock, operable for transferring:
      i. an implanted workpiece from said first carousel to said load lock,
      ii. a fresh workpiece from said load lock to said first carousel,
   c. an atmospheric swapping means disposed outside said target chamber, between said load lock and said second carousel, operable for transferring:
      i. an implanted workpiece from said load lock to said second carousel,
      ii. a fresh workpiece from said second carousel to said load lock.

4. The machine of claim 1 wherein said second carousel is located inside said target vacuum chamber, said machine further comprising:
   a. a load lock coupled to target vacuum chamber, said load lock operable to receive at least one slice and transfer said at least one slice out of vacuum,
   b. a transfer mechanism disposed inside said target vacuum chamber, adapted to transfer a slice from said second carousel to said load lock.

5. The machine of claim 1 wherein said second carousel is located inside said target vacuum chamber, said machine further comprising:
   a. at least one load lock coupled to said target vacuum chamber, said at least one load lock operable to transfer workpieces into or out of vacuum,
   b. at least one transfer mechanism disposed inside said target chamber between said at least one load lock and said second carousel, adapted to transfer workpieces between said second carousel and said at least one load lock,
   whereby new workpieces may be fed into said machine, the remnant of fully-sliced workpieces may be removed from said machine, and dummy workpieces may be inserted into, or removed from, the stream of workpieces at selected locations.

6. The machine of claim 1 wherein said plurality of stations further comprises at least one station selected from the group consisting of:
   a. an annealing station adapted for heating a workpiece,
   b. a bonding station adapted for bonding a handle substrate to a workpiece, c. a cleaning station adapted for cleaning a slice,
d. a slice removal station adapted for removing a slice from said second carousel,
e. a workpiece input and output station adapted for transferring a fresh workpiece or dummy workpiece to said second carousel, and for removing the remnant of a fully sliced workpiece or dummy workpiece from said second carousel.

7. The machine of claim 2 wherein N is changed over time to compensate for changes in workpiece temperature arising from the gradual thinning of the workpieces as they are sliced.

8. The machine of claim 1 wherein said first carousel further comprises:
   a. a sealed conduit,
   b. a coolant circulated through said conduit,
   c. a thermal coupling means disposed between said first carousel and each of the workpieces thereupon,
   whereby heat is efficiently transferred from the workpieces to said coolant.

9. The machine of claim 8 wherein said thermal coupling means is a gas.

10. The machine of claim 1 wherein said load lock is provided with at least one movable wall, wherein the internal volume of said load lock is adjusted in accordance with the size of the workpiece contained therein, whereby the quantity of gas to be pumped out of said load lock is minimized.

11. A machine for slicing workpieces with an ion beam, comprising:
    a. a target vacuum chamber,
    b. an ion beam of preselected energy,
    c. a first carousel inside said target vacuum chamber adapted for circulating a plurality of workpieces, numbering M, through said ion beam,
    d. a plurality of stations comprising at least:
       i. a workpiece swapping station,
       ii. a cleaving station,
    e. a second carousel adapted for circulating workpieces sequentially from station to station,
    f. at least one buffer adapted for receiving and supporting a plurality of workpieces,
    g. a first workpiece swapping means operable for transferring workpieces between said first carousel and said at least one buffer,
    h. a second workpiece swapping means operable for transferring workpieces between said second carousel and said at least one buffer,
    wherein:
       i. said first carousel is advanced, exposing all M workpieces equally to said ion beam and implanting ions in a layer at a preselected depth therein,
       ii. following each advancement of said first carousel, said first workpiece swapping means is operated to transfer all M implanted workpieces from said first carousel to said at least one buffer and to transfer M fresh workpieces from said at least one buffer to said first carousel,
       iii. said second carousel is advanced, moving each of its workpieces to a subsequent station, thereby moving one workpiece to said cleaving station, wherein material above the implanted layer is separated from the workpiece, thereby forming a slice, and moving one workpiece to said workpiece swapping station,
       iv. following each advancement of said second carousel, said second workpiece swapping means is operated to exchange the workpiece in said workpiece swapping station with an implanted workpiece in said buffer,
    whereby each workpiece is repeatedly implanted on said first carousel and cleaved on said second carousel, producing a plurality of slices.

12. The machine of claim 11 wherein said second carousel is disposed inside said target vacuum chamber, said machine further comprising:
    a. at least one load lock coupled to said target vacuum chamber, said at least one load lock operable to transfer workpieces into or out of vacuum,
    b. at least one transfer mechanism disposed inside said target chamber between said at least one load lock and said second carousel, adapted to transfer workpieces between said second carousel and said at least one load lock,
    c. A slice removal load lock coupled to said target vacuum chamber, said slice removal load lock operable to transfer slices into or out of vacuum,
    d. a slice transfer mechanism disposed inside said target chamber between said slice removal load lock and said second carousel, adapted to transfer slices between said second carousel and said slice removal load lock,
    whereby new workpieces may be fed into said machine, slices may be removed from said machine, the remnant of fully-sliced workpieces may be removed from said machine, and dummy workpieces may be inserted into, or removed from, the stream of workpieces at selectable locations.

13. The machine of claim 11 wherein said second carousel is disposed outside said target vacuum chamber, said machine further comprising at least one load lock coupled to said target vacuum chamber and disposed between said first workpiece swapping means and said second workpiece swapping means, each said at least one buffer being disposed within a said at least one load lock, whereby each load lock containing a buffer defines a batch load lock.

* * * * *